United States Patent [19]

Nagano et al.

[11] 4,399,210

[45] Aug. 16, 1983

[54] PHOTOSENSITIVE COMPOSITIONS

[75] Inventors: Teruo Nagano, Minami-ashigara; Akira Nagashima, Shizuoka, both of Japan

[73] Assignee: Fuji Photo Film Company Ltd., Kanagawa, Japan

[21] Appl. No.: 364,274

[22] Filed: Apr. 1, 1982

[30] Foreign Application Priority Data

Apr. 1, 1981 [JP] Japan .................... 56-49716

[51] Int. Cl.³ .................. G03C 1/54; G03C 1/60; G03C 1/71
[52] U.S. Cl. .................. 430/175; 430/5; 430/145; 430/176; 430/177; 430/191; 430/192; 430/193; 430/292; 430/294
[58] Field of Search ............ 430/191, 192, 193, 175, 430/292, 294, 145, 5, 176, 177

[56] References Cited

U.S. PATENT DOCUMENTS

| | | | |
|---|---|---|---|
| 3,046,123 | 9/1962 | Sus et al. | 430/193 |
| 3,106,465 | 10/1963 | Neugebauer et al. | 430/193 |
| 3,669,658 | 6/1972 | Yonezawa et al. | 430/191 |
| 3,969,118 | 7/1976 | Stahlhofen et al. | 430/191 |
| 3,984,250 | 10/1976 | Holstead | 260/141 D |
| 4,028,111 | 7/1977 | Iwasaki et al. | 430/191 |
| 4,115,128 | 9/1978 | Kita | 430/191 |
| 4,163,672 | 8/1979 | Stahlhofen | 430/191 |
| 4,207,107 | 6/1980 | Ross | 430/193 |
| 4,294,905 | 10/1981 | Okishi et al. | 430/192 |
| 4,307,173 | 12/1981 | Gverter | 430/193 |

FOREIGN PATENT DOCUMENTS 2038801 7/1980 United Kingdom ............. 430/193

Primary Examiner—Charles L. Bowers, Jr.
Attorney, Agent, or Firm—Sughrue, Mion, Zinn, Macpeak and Seas

[57] ABSTRACT

A photosensitive composition containing at least one o-naphthoquinonediazide compound represented by the following general formula (I):

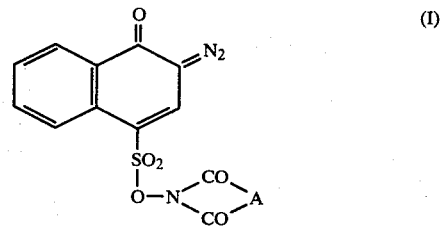

wherein A represents a divalent aliphatic residue, a divalent substituted aliphatic residue, a divalent aromatic residue or a divalent substituted aromatic residue, and a discoloring agent which changes its color tone upon the interaction with a photodecomposition product of the o-naphthoquinonediazide compound.

The photosensitive composition directly provides visible contrast between exposed portions and unexposed portions upon light exposure without development and is particularly useful for making lithographic printing plates, letterpress printing plates, IC circuits, photomasks, etc.

23 Claims, No Drawings

PHOTOSENSITIVE COMPOSITIONS

FIELD OF THE INVENTION

The present invention relates to a photosensitive composition suitable for the production of a lithographic printing plate, a letterpress printing plate an IC circuit or a photomask. More particularly, the present invention relate to a photosensitive composition providing a visible image just after imagewise exposure which comprises a combination of an o-naphthoquinonediazide compound and a certain kind of a discoloring agent.

BACKGROUND OF THE INVENTION

It is known that an ester compound or an amide compound of an o-naphthoquinonediazidosulfonic acid is employed as a photosensitive composition. These compounds are widely used in the industries for the production of lithographic printing plates, in particular, the so-called presensitized plates which comprise a coating of a photosensitive composition previously applied to a support (usually referred to as PS plates) or as photoresist materials for letterpress printing plates, IC circuits, photomasks or printed wirings.

However, the photosensitive compositions containing an o-naphthoquinonediazide compound have the following drawbacks. That is, when a photosensitive o-naphthoquinonediazide compound having yellow color is exposed to light, the compound is subjected to fading to form a colorless or light-yellow colored photodecomposition product, and under a yellow safety light in exposure work, however, the exposed portions and unexposed portions can not be discriminated. Thus, it is impossible to determine, for example, whether the printing plate has been exposed or not in the event that printing work is interrupted when simultaneously exposing many printing plates. Similarly, for example, when a large plate is repeatedly exposed for making a lithographic printing plate as in the so-called plate-setting printing method, it can not be confirmed whether and what portions were exposed. Therefore, they cause errors in the operation and result in remarkable decrease of work efficiency.

In order to eliminate these drawbacks, several attempts have been made for directly providing a visible image after the exposure of a photosensitive composition. For instance, the use of a various kind of reduction susceptive salts as shown in U.S. Pat. Nos. 2,006,913 and 2,618,555 in a mixture together with a diazo compound; the method of forming a visible image from a combination of a photosensitive diazo compound and an acid alkaline indicator as described in Japanese Patent Publication No. 2203/1965; a composition of a photosensitive positive acting diazo resin and a merocyanine dye as described in Japanese Patent Publication No. 3041/1974; a printing plate previously sensitized with an o-naphthoquinonediazide which contains uniform particles of an organic coloring agent which changes its color in a pH range of 2.5 to 6.5 in a photosensitive layer thereof as described in Japanese Patent Publication No. 21093/1965; a photosensitive duplicating layer of an ester or amide of an o-naphthoquinonediazidosulfonic acid which contains an o-naphthoquinonediazido-4-sulfonic acid halogenide and an organic compound capable of forming a salt as a dye in the ranges of 10 to 75% by weight and 1 to 50% by weight based on the total amount of the o-naphthoquinonediazide compound, respectively as described in Japanese Patent Application (OPI) No. 36209/1975; a mixture of an ester compound of a phenol substituted with an electron attractive substituent and o-naphthoquinonediazido-4-sulfonic acid and an organic dye which changes its color tone upon the interaction with a photodecomposition product of the o-naphthoquinonediazide compound as described in British Patent Publication No. 2,038,801A, or the like.

However, even in these cases in which such an improvement has been performed, the contrast of a visible image obtained by exposure is insufficient for practical working under a yellow safety light in most cases and, thus, it does not reach a level at which the above described plate-setting printing work can be conducted without hindrance. Also, it is usually observed that the physical properties and the developing property of the photosensitive layer are largely influenced even when a sufficient contrast is obtained. Further, the sufficient contrast is not obtained after the storage for a long period of time and therefore, satisfactory results can not be obtained at present.

SUMMARY OF THE INVENTION

An object of the present invention is, therefore, to provide a photosensitive composition which can provide a visible image with high contrast upon exposure to light.

Another object of the present invention is to provide a highly sensitive photosensitive composition which can provide a photosensitive layer having excellent physical properties and developing property.

Still another object of the present invention is to provide a photosensitive composition containing an o-naphthoquinonediazide compound which can provide sufficient contrast even after storage for a long period of time.

Other objects of the present invention will become apparent from the following detailed description and examples.

As the results of various investigations, it has been found that the above described objects can be attained by a photosensitive composition containing at least one o-naphthoquinonediazide compound represented by the following general formula (I):

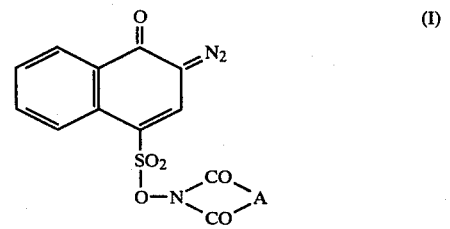

wherein A represents a divalent aliphatic residue, a divalent substituted aliphatic residue, a divalent aromatic residue or a divalent substituted aromatic residue, and a discoloring agent which changes its color tone upon the interaction with a photodecomposition product of the o-naphthoquinonediazide compound.

DETAILED DESCRIPTION OF THE INVENTION

In the general formula (I) described above, the divalent aliphatic residue represented by A is a straight chain, branched chain and/or cyclic aliphatic residue containing a saturated bond and/or unsaturated bond and preferably having about 2 to about 20 carbon atoms. Preferred examples of the divalent aliphatic residue include, for example, an ethylene group, a triethylene group, a propylene group, an ethylethylene group, a 1,1-dimethylethylene group, a 1-ethyl-1-methylethylene group, a 1,2-dimethylethylene group, a tetramethylethylene group, a dodecylethylene group, an octadecylethylene group, a 2-methyltrimethylene group, a 2-ethyltrimethylene group, a 1,1-dimethyltrimethylene group, a 2,2-dimethyltrimethylene group, a 2-ethyl-2-methyltrimethylene group, a 1-ethyl-3-methyltrimethylene group, a 1,2-cyclobutylene group, a 1,2-cyclohexylene group, a 1,2,2-trimethyl-1,3-cyclopentylene group, a 2,3-norbornylene group, a vinylene group, a methylvinylene group, a 1,1-dimethylvinylene group, a methylethylene group, a nonenylethylene group, a dodecenylethylene group, an octadecenylethylene group, a 1-cyclohexen-1,2-ylene group, a 4-cyclohexen-1,2-ylene group, a 5-methyl-4-cyclohexen-1,2-ylene group, a 4,5,6-trimethyl-4-cyclohexen-1,2-ylene group, a 5-norbornen-2,3-ylene group, a biscyclo[2,2,2]oct-5-en-2,3-ylene group, or the like.

The divalent substituted aliphatic residue represented by A includes a divalent aliphatic residue as described above which is substituted with an aryl group, for example, a phenyl group, etc.; in which an ether bond is formed by introducing an oxygen atom; which is substituted with a halogen atom, for example, a chlorine atom, etc.; or the like. Preferred examples of the divalent substituted aliphatic residue include, for example, a 1-methyl-1-phenylethylene group, a 1-benzyl-1-methylethylene group, a 1-phenylethylene group, a 1,1-diphenylethylene group, a 1-phenyltrimethylene group, a 2-phenyltrimethylene group, 1-ethyl-1-phenyltrimethylene group, a phenylvinylene group, a 3,6-oxo-1,2,3,6-tetrahydrophthalyl group, a 1,4,5,6,7,7-hexachloro-5-norbornen-2,3-ylene group, or the like.

The divalent aromatic residue represented by A includes an arylene group and an aromatic heterocyclic residue and is preferably a monocyclic or dicyclic group. Preferred examples of the divalent aromatic residue include, for example, an o-phenylene group, a 1,2-naphthylene group, a 1,8-naphthylene group, a 2,3-pyridinediylyl group, a 2,3-pyrazinediylyl group, a 2,3-benzo[b]thiophenediylyl group, or the like.

The divalent substituted aromatic residue represented by A includes a divalent aromatic residue as described above which is substituted with a lower alkyl group, for example, a methyl group, etc., which is substituted with a halogen atom, for example, a chlorine atom, a bromine atom, etc., which is substituted with a nitro group, an acetamino group, etc., or the like. Preferred examples of the divalent substituted aromatic residue include, for example, a 3-methyl-1,2-phenylene group, a 4-methyl-1,2-phenylene group, a 3-chloro-1,2-phenylene group, a 4-chloro-1,2-phenylene group, a 3-bromo-1,2-phenylene group, a 3,6-dichloro-1,2-phenylene group, a 3,6-dibromo-1,2-phenylene group, a 3,4,5,6-tetrachloro-1,2-phenylene group, a 3,4,5,6-tetrabromo-1,2-phenylene group, a 3-nitro-1,2-phenylene group, a 3-acetamino-1,2-phenylene group, a 4-chloro-1,8-naphthylene group, a 4-bromo-1,8-naphthylene group, a 4,5-dichloro-1,8-naphthylene group, a 4,5-dibromo-1,8-naphthylene group, a 4-bromo-5-chloro-1,8-naphthylene group, a 4-nitro-1,8-naphthylene group, a 5-methyl-2,3-benzo[b]thiophenediylyl group, a 5-chloro-2,3-benzo[b]thiophenediylyl group, a 1-ethyl-2,3-indolediylyl group, or the like.

The o-naphthoquinonediazide compound represented by the general formula (I) described above which can be used in the present invention can be synthesized by the dehydrochlorination condensation reaction of a compound represented by the following general formula (II):

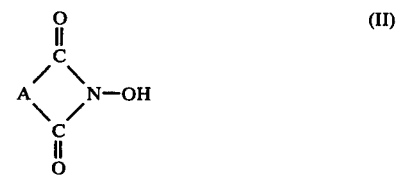

(II)

wherein A has the same meaning as defined in the general formula (I), with 1,2-naphthoquinone-2-diazido-4-sulfonic acid chloride in the presence of a dehydrochlorinating agent. The compound represented by the general formula (II) can be synthesized according to, for example, the method described in G. F. Jaubert, *Berichte der Deutschen Chemischen Gesellschaft*, vol. 28, pages 360 to 364 (1895), the method described in D. E. Ames et al., *Journal of the Chemical Society*, pages 3518 to 3521 (1955), the method described in M. A. Stolberg et al., *Journal of the American Chemical Society*, vol. 79, pages 2615 to 2617 (1957), the method described in L. Bauer et al., *Journal of Organic Chemistry*, vol. 24, pages 1293 to 1296 (1959), or the method described in L. M. Werbel et al., *Journal of Medical Chemistry*, vol. 10, pages 32 to 36 (1967) all of which are incorporated herein by reference.

The condensation reaction can be carried out in both an aqueous medium and an organic solvent as far as a dehydrochlorinating agent is present. In the case of an aqueous medium, lithium hydroxide, sodium hydroxide, potassium hydroxide, sodium carbonate, potassium carbonate, etc. are preferred as a dehydrochlorinating agent. When the reaction is carried out in an organic solvent, an organic solvent which does not contain a hydroxy group, for example, diethyl ether, diisopropyl ether, acetone, dichloromethane, chloroform, carbon tetrachloride, tetrahydrofuran, dioxane, ethyl acetate, benzene, tolune, acetonitrile, etc. is preferred as an organic solvent and pyridine, diethylamine, triethylamine, N,N-dimethylaniline, N,N-diethylaniline, etc. are preferably used as a dehydrochlorinating agent.

The reaction is preferably carried out by using 1 to 1.5 equivalents of 1,2-naphthoquinone-2-diazido-4-sulfonic acid chloride and 1 to 1.5 equivalents of dehydrochlorinating agent per 1 equivalent of the compound represented by the general formula (II). The reaction temperature is preferably in a range between $-10°$ C. and $40°$ C.

Of the compounds represented by the general formula (I), those in which A is an alkylene group, an alkenylene group, a phenylene group or a substituted phenylene group having an alkyl group containing 1 to 4 carbon atoms or a halogen atom as the substituent are preferred, and those in which A is an alkyl-substituted phenylene group, a halogen-substituted phenylene group or a phenylene group are particularly advantageous in view of the effects of the present invention.

The compounds having the structural formula shown below are preferred examples of the o-naphthoquinonediazide compounds which can be used in the present invention. However, the present invention is not to be construed as being limited to those compounds.
No. 1
No. 2
No. 3
No. 4
No. 5
No. 6
No. 7
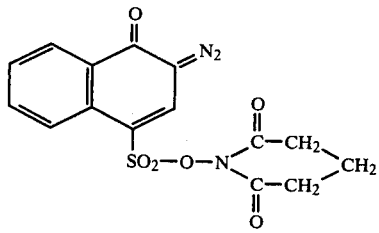
No. 8
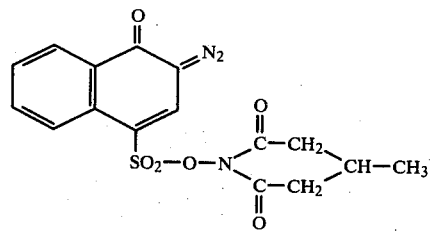
No. 9
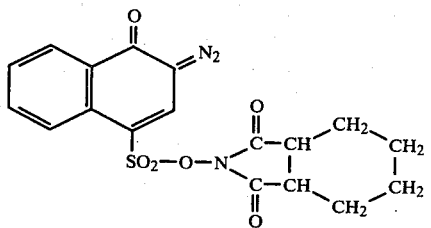
No. 10
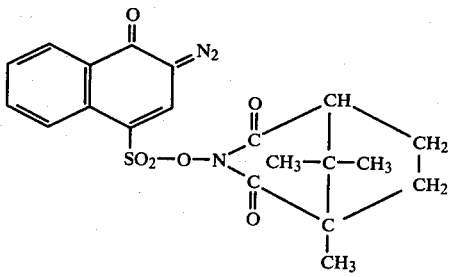
No. 11
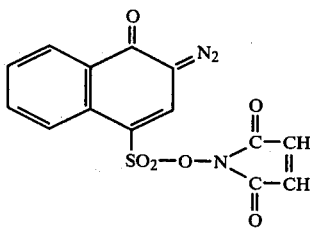
No. 12
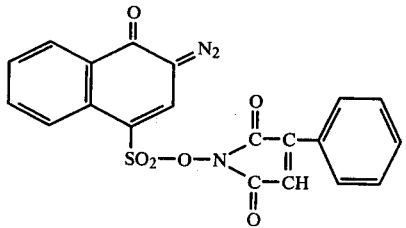

-continued

No. 13

[chemical structure]

No. 14

[chemical structure]

No. 15

[chemical structure]

No. 16

[chemical structure]

No. 17

[chemical structure]

No. 18

[chemical structure]

No. 19

[chemical structure]

No. 20

[chemical structure]

No. 21

[chemical structure]

No. 22

[chemical structure]

No. 23

[chemical structure]

No. 24

[chemical structure]

The compound represented by the general formula (I) very effectively forms a free radical when irradiated by actinic light of about 250 nm to about 500 nm wavelength. Therefore, when the compound represented by the general formula (I) is used as a component to generate a free radical upon the irradiation of actinic light (hereinafter, referred to as a free radical generating agent) in a photosensitive composition in which the free radical generating agent is an essential component, for example, in a photosensitive material used for making a lithographic printing plate, a letterpress printing plate, an intaglio printing plate, etc.; in a photosensitive composition used for making a photoresist material and other photographic elements; and in a photosensitive composition directly providing visible contrast between the exposed portions and unexposed portions by exposure alone; a photosensitive composition of high sensitivity is obtained. The compound represented by the general formula (I) according to the present invention is particularly useful in directly providing visible contrast between exposed portions and unexposed portions upon light exposure without development (herein, referred to as "printout faculty") in a photosensitive resist forming composition for making a lithographic printing plate, an IC circuit, a photomask, etc. Using a photosensitive resist composition having printout faculty, the images, which are visible under a yellow safety light in exposure work, can be obtained by light exposure alone. Thus, it is possible to determine, for example, whether the printing plate has been exposed or not in the event that printing work is interrupted when simultaneously exposing many printing plates. Similarly, when a large plate is repeatedly exposed for making a lithographic printing plate as in the so-called plate-setting printing method, it can be immediately confirmed whether and what portions were exposed.

The composition used for providing such a printout faculty (hereinafter, referred to as print-out compositions) is composed of a free radical generating agent and a discoloring agent which is discolored by the free radical formed by the free radical generating agent, and according to the present invention, the compound shown in the above described general formula (I) is used as the free radical generating agent.

There are two kinds of discoloring agents which change their color tone upon the interaction with the photodecomposition product of the o-naphthoquinonediazide compound according to the present invention, i.e. a discoloring agent which is inherently colorless but is converted into a colored state and a discoloring agent which is itself colored and is discolored or decolored.

Typical examples of the discoloring agent belonging to the former type are arylamines. Suitable arylamines include not only simple arylamines such as primary aromatic amines and secondary aromatic amines but also leuco dyes. Typical examples include diphenylamine, dibenzylaniline, triphenylamine, diethylaniline, diphenyl-p-phenylenediamine, p-toluidine-4,4'-biphenyldiamine, o-chloroaniline, o-bromoaniline, 4-chloro-o-phenylenediamine, o-bromo-N,N-dimethylaniline, 1,2,3-triphenylguanidine, naphthylamine, diaminodiphenylmethane, aniline, 2,5-dichloroaniline, N-methyldiphenylamine, o-toluidine, p,p'-tetramethyldiaminodiphenylmethane, N,N-dimethyl-p-phenylenediamine, 1,2-dianilinoethylene, p,p',p"-hexamethyltriaminotriphenylmethane, p,p'-tetramethyldiaminotriphenylmethane, p,p'-tetramethyldiaminodiphenylmethylimine, p,p',p"-triamino-o-methyltriphenylmethane, p,p',p"-triaminotriphenylcarbinole, p,p'-tetramethylaminodiphenyl-4-anilinonaphthylmethane, p,p',p"-triaminotriphenylmethane, and p,p',p"-hexapropyltriaminotriphenylmethane.

Also, as the discoloring agents which are originally colored but are discolored or decolored by the photodecomposition products of the o-naphthoquinonediazide compounds, there are effectively employed diphenylmethane series dyes, triphenylmethane series dyes, thiazine series dyes, oxazine series dyes, xanthene series dyes, anthraquinone series dyes, iminonaphthoquinone series dyes, azomethine series dyes, etc. Typical examples of such discoloring agents are Brilliant Green, Eosine, Ethyl Violet, Erythrosine B, Methyl Green, Crystal Violet, Basic Fuchsine, phenolphthalein, 1,3-diphenyltriazine, Alizarine Red S, Thymolphthalein, Methyl Violet 2B, Quinaldine Red, Rose Bengale, Metanil Yellow, Thymolsulfophthalein, Xylenol Blue, Methyl Orange, Orange IV, diphenylthiocarbazone, 2,7-dichlorofluorescein, Paramethyl Red, Congo Red, Benzopurpurine 4B, α-Naphthyl Red, Nile Blue 2B, Nile Blue A, Phenacetaline, Methyl Violet, Malachite Green, Parafuchsine, Oil Blue #603 (trade name, made by Orient Kagaku Kogyo K.K.), Oil Pinc #312 (trade name, made by Orient Kagaku Kogyo K.K.), Oil Red 5B (trade name, made by Orient Kagaku Kogyo K.K.), Oil Scarlet #308 (trade name, made by Orient Kagaku Kogyo K.K.), Oil Red OG (trade name, made by Orient Kagaku Kogyo K.K.), Oil Red RR (trade name, made by Orient Kagaku Kogyo K.K), Oil Green #502 (trade name, made by Orient Kagaku Kogyo K.K.), Spiron Red BEH Special (trade name, made by Hodogaya Kagaku Kogyo K.K.), m-Cresol Purple, Cresol Red, Rhodamine B, Rhodamine 6G, Fast Acid Violet R, sulforhodamine B, Auramine, 4-p-diethylaminophenyliminonaphthoquinone, 2-carboxyanilino-4-p-diethylaminophenyliminonaphthoquinone, 2-carbostearylamino-4-p-dihydroxyethylaminophenyliminonaphthoquinone, p-methoxybenzoyl-p'-diethylamino-o'-methylphenyliminoacetanilide, cyano-p-diethylaminophenyliminoacetanilide, 1-phenyl-3-methyl-4-p-diethylaminophenylimino-5-pyrazolone, 1-β-naphthyl-4-p-diethylaminophenylimino-5-pyrazolone, etc.

The ratio of the compound represented by the general formula (I) to the discoloring agent as described above in a printout composition can be varied widely but is preferably from about 0.01 parts by weight to about 100 parts by weight, more preferably 1 part by weight to 50 parts by weight of the compound represented by the general formula (I) per 1 part by weight of the discoloring agent.

On the other hand, the photosensitive resist forming compositions to which the printout faculty is provided by the printout compositions according to the present invention include compositions used for making various printing plates such as lithographic printing plates, etc., as well as IC circuits, photomasks, etc. Typical examples are explained below.

(1) Compositions containing diazo resins

The diazo resin typified by a condensation products of p-diazodiphenylamine and paraformaldehyde may be water-soluble or water-insoluble but the diazo resin which is insoluble in water but soluble in an ordinary organic solvent is preferably used. Particularly preferred photosensitive diazo compounds include compounds having two or more diazo groups in one molecule, such as a salt of the condensation products of p-diazodiphenylamine with formaldehyde or acetaldehyde. For example, the phenolate salt, the fluorocaprate salt and sulfonates thereof such as the triisopropylnaphthalene sulfonate salt, the 4,4'-biphenyldisulfonate salt, the 5-nitro-o-toluenesulfonate salt, the 5-sulfosalicylate salt, the 2,5-dimethylbenzenesulfonate salt, the 2-nitrobenzenesulfonate salt, the 3-chlorobenzenesulfonate salt, the 3-bromobenzenesulfonate salt, the 2-chloro-5-nitrobenzenesulfonate salt, the 2-fluorocapylnaphthalenesulfonate salt, the 1-naphthol-5-sulfonate salt, the 2-methoxy-4-hydroxy-5-benzoylbenzenesulfonate salt and the p-toluenesulfonate salt. Other preferred diazo resins include condensation products of 2,5-dimethoxy-4-p-tolylmercaptobenzene diazonium salts with formaldehyde and condensation products of 2,5-dimethoxy-4-morpholinobenzene diazonium salts with formaldehyde or acetaldehyde, each of which includes the salts described above. Further, the diazo resins as described in British Pat. No. 1,312,925 are also preferred.

The diazo resin may be used alone as a photosensitive component for making resists but is preferably used together with a binder. Various polymers can be used as the binder but polymers containing a hydroxy group, an amino group, a carboxylic acid group, an amido group, a sulfonamido group, an active methylene group, a thioalcohol group, an epoxy group, etc., are preferred. Such preferred binders include shellacs such as described in British Pat. No. 1,350,521; polymers having a hydroxyethyl acrylate unit or a hydroxyethyl methacrylate unit as the main recurring unit such as described in British Pat. No. 1,460,978 and U.S. Pat. No. 4,123,276; polyamide resins such as described in U.S. Pat. No. 3,751,257; phenol resins such as described in British Pat. No. 1,074,392; polyvinylacetal resins such as a polyvinylformal resin and a polyvinylbutyral resin; linear polyurethane resins such as described in U.S. Pat. No. 3,660,097; phthalated resins of polyvinyl alcohol; epoxy resins formed by the condensation of bisphenol A and epichlorohydrin; polymers containing an amino group such as polyaminostyrene and polyalkylamino acrylate or polyalkylamino methacrylate; and celluloses such as cellulose acetate, cellulose alkyl ether, cellulose acetate phthalate, etc.

The proper proportion of the binder is 40 to 95% by weight of the photosensitive resist forming composition. If the proportion of the binder increases (i.e., the proportion of the diazo resin decreases), the photosensitivity of the photosensitive composition increases as a matter of course but the storage stability becomes poor. The optimum proportion of the binder is about 70 to 90% by weight.

The composition containing the diazo resin may further contain additives such as dyes and pigments other than the discoloring agent, such as phosphoric acid as described in U.S. Pat. No. 3,236,646.

(2) Compositions of o-quinonediazide compounds

Particularly preferred o-quinonediazide compounds are o-naphthoquinonediazide compounds such as described in, for example, U.S. Pat. Nos. 2,766,118, 2,767,092, 2,772,972, 2,859,112, 2,907,665, 3,046,110, 3,046,111, 3,046,115, 3,046,118, 3,046,119, 3,046,120, 3,046,121, 3,046,122, 3,046,123, 3,061,430, 3,102,809, 3,106,465, 3,635,709 and 3,647,443 all incorporated herein by reference (as well as many other publications). Among these compounds, the o-naphthoquinonediazido sulfonic acid ester or the o-naphthoquinonediazido carboxylic acid ester of an aromatic hydroxy compound and the o-naphthoquinonediazidosulfonic acid amide or the o-naphthoquinonediazidocarboxylic acid amide of an aromatic amino compound are particularly preferred. In particular, the product obtained by the esterification reaction of the condensation product of pyrogallol and acetone and o-naphthoquinonediazidosulfonic acid as described in U.S. Pat. No. 3,635,709; the product obtained by the esterification reaction of a polyester having a terminal hydroxy group and o-naphthoquinonediazidosulfonic acid or o-naphthoquinonediazidocarboxylic acid as described in U.S. Pat. No. 4,028,111; the product obtained by the esterification reaction of the homopolymer of p-hydroxystyrene or a copolymer of p-hydroxystyrene and a monomer copolymerizable with styrene and o-naphthoquinonediazidosulfonic acid or o-naphthoquinonediazidocarboxylic acid as described in British Pat. No. 1,494,043; and the product obtained by the amido reaction of a copolymer of p-aminostyrene and another monomer copolymerizable with it and o-naphthoquinonediazidosulfonic acid or o-naphthoquinonediazidocarboxylic acid as described in U.S. Pat. No. 3,759,711 are very excellent.

These o-quinonediazide compounds may be used alone but are preferably used as a mixture with an alkali-soluble resin. The preferred alkali-soluble resin is a novolak type phenol resin. Particularly useful resins include a phenolformaldehyde resin, an o-cresol-formaldehyde resin, an m-cresol-formaldehyde resin, etc. Furthermore, it is more preferred to use the above-described phenol resin together with a condensation product of formaldehyde and a phenol or cresol substituted by an alkyl group of 3 to 8 carbon atoms, such as a t-butylphenol-formaldehyde resin as described in Japanese Patent Application (OPI) No. 125806/1975. The content of the alkali-soluble resin is from about 50 to about 85% by weight, preferably 60 to 80% by weight based on the total weight of the photosensitive resist forming composition.

The photosensitive composition composed of the o-quinonediazide compound may further contain, as the case may be, pigments or dyes which are not the discoloring agent and plasticizers, etc.

When the above described printout composition according to the present invention is incorporated into a photosensitive resist forming composition, printout composition is used in an amount of about 0.1 part by weight to about 150 parts by weight, preferably 1 part by weight to 60 parts by weight per 100 parts by weight of the photosensitive resist forming composition.

The photosensitive resist forming composition endowed with such a printout faculty is coated using a solvent such as ethylene dichloride, cyclohexanone, methyl ethyl ketone, 2-methoxyethyl acetate, monochlorobenzene, toluene, ethyl acetate, etc., individually or in a mixture thereof.

Photosensitive resist forming compositions endowed with such a printout faculty are advantageously used in a photosensitive layer for a photosensitive lithographic printing plate which is employed for making a lithographic printing plate. In this case, the support for the photosensitive lithographic printing plate include metal plates such as aluminum plates (including aluminum alloys), zinc plates, iron plates, copper plates as well as plastic sheets having laminated or vapor deposited thereon such a metal. The most preferred support is an aluminum plate.

When using a metal support, in particular a support having an aluminum surface, it is preferred that the support be subjected to a surface treatment such as graining, immersion in an aqueous solution of sodium silicate, potassium fluorozirconate, a phosphate, etc.; or anodic oxidation. Also, an aluminum plate which is grained and then subjected to immersion treatment in an aqueous solution of sodium silicate as described in U.S. Pat. No. 2,714,066 and an aluminum plate which is subjected to anodic oxidation treatment and then to immersion treatment in an aqueous solution of an alkali metal silicate as described in U.S. Pat. No. 3,181,461 are preferably used.

The above-described anodic oxidation treatment is practiced by passing an electric current through an aluminum plate as an anode in an aqueous solution or a non-aqueous solution of an inorganic acid such as phosphoric acid, chromic acid, sulfuric acid, boric acid, etc., or an organic acid such as oxalic acid, sulfamic acid, etc., or salts thereof as the single solution or a combination of the solutions, more particularly an aqueous solution of phosphoric acid, sulfuric acid or a mixture of them. The electric deposition of silicate as described in U.S. Pat. No. 3,658,662 is also effective. Furthermore, an aluminum plate which is electrolyzed in hydrochloric acid electrolyte by an alternating current and then subjected to an anodic oxidation in a sulfuric acid electrolyte as described in British Pat. No. 1,208,224 is often preferred. It may be desirable to form a subbing layer of a cellulosic resin containing a water-soluble salt of a metal such as zinc, etc., on an aluminum plate which is subjected to anodic oxidation as described above to prevent the formation of scum when printing.

The coverage of the photosensitive layer formed on the support as described above is in a range of from about 0.1 g/m$^2$ to about 7 g/m$^2$, preferably about 0.5 g/m$^2$ to 4 g/m$^2$.

The PS plate thus prepared is imagewise exposed and then subjected to processings including development in an ordinary manner to form images thereon. For example, in the case of a PS plate having a photosensitive layer composed of the photosensitive composition having the printout composition contained in the above-mentioned composition (1) composed of the diazo resin, the PS plate is imagewise exposed and then the non-exposed portions of the photosensitive layer are removed by development, thereby a lithographic printing plate is obtained. In the case of a PS plate having a photosensitive layer composed of the photosensitive composition having a printout composition contained in the above-mentioned composition (2), the PS plate is imagewise exposed and then the exposed portions of the photosensitive layer are removed by development with an aqueous alkaline solution, thereby a lithographic printing plate is obtained. In the PS plates having any sort of photosensitive layers, the PS plates may be developed using known developers suitable for each photosensitive composition without requiring any specific technique for the photosensitive composition endowed with the printout faculty according to the present invention.

The photosensitive resist forming composition endowed with the printout faculty described above can also be used for making proof plates for prints, films for overhead projectors, and films for secondary originals. As the supports suitable for these materials, there are transparent films such as polyethylene terephthalate films, cellulose triacetate films, etc., and plastic films the surface of which has been chemically or mechanically matted.

Furthermore, the above-described photosensitive resist forming compositions can be used for making films for photomasks. Supports suitable for the purpose are polyethylene terephthalate films vapor-deposited with aluminum, an aluminum alloy or chromium and polyethylene terephthalate films having a colored layer thereon.

Still further, the aforesaid photosensitive compositions can be used as photoresists. In this case, copper plates, copper-plated plates, stainless steel plates, glass sheets, etc., can be used as the supports.

It is surprising that the free radical generating agent according to the present invention is decomposed by the action of light in a photosensitive resist forming compositions containing various photosensitive resist forming compounds and immediately effectively discolors a copresent discoloring agent and, as the result of such discoloring, a clear boundary is obtained between the exposed portions and unexposed portions, which provides visible images having high contrast.

Further, since a wide range of discoloring agents can be used, a suitable discoloring agent can be selected, even when various additives are added to the photosensitive composition in order to improve the properties thereof.

The present invention will be explained in more detail with reference to the following synthesis examples and examples, but the present invention is not to be construed as being limited thereto.

SYNTHESIS EXAMPLE 1

Synthesis of N-(1,2-naphthoquinone-2-diazido-4-sulfonyloxy)succinimide [Compound No. 1]

100 ml of tetrahydrofuran was added to 6.9 g of N-hydroxysuccinimide and 16.1 g of 1,2-naphthoquinone-2-diazido-4-sulfonyl chloride and to the mixture was added dropwise with stirring a solution containing 6.1 g of triethylamine dissolved in 20 ml of tetrahydrofuran while cooling the temperature of the reaction solution below 20° C. for 2 hours. After further reacting for 2 hours at a temperature of 15° C. to 25° C., the reaction solution was poured into 400 ml of water. The precipitates thus formed were collected by filtration and recrystallized from a solvent mixture of acetonitrile and methyl Cellosolve to obtain 15.5 g of N-(1,2-naphthoquinone-2-diazido-4-sulfonyloxy)succinimide. The melting point was 168° to 171° C. (decomp.).

SYNTHESIS EXAMPLE 2

Synthesis of N-(1,2-naphthoquinone-2-diazido-4-sulfonyloxy)-2,2-dimethylsuccinimide [Compound No. 2]

50 g of 2,2-dimethylsuccinic acid and 70 ml of acetic anhydride were reacted at 140° C. for 3 hours and, after removing acetic acid and acetic anhydride under reduced pressure, the residue was subjected to vacuum distillation to obtain 37 g of 2,2-dimethylsuccinic anhydride.

To 22 g of 2,2-dimethylsuccinic anhydride, was added 30 ml of water, and while cooling the reaction temperature below 20° C., 11 g of sodium carbonate and then 14 g of hydroxylamine hydrochloride were added to the mixture. The mixture was reacted at room temperature for 1 hour and then reacted at a temperature of 40° to 50° C. for 1 hour. After cooling to 5° C., 5 ml of concentrated hydrochloric acid and 10 ml of methanol were added to the reaction mixture and N-hydroxy-2,2-dimethylsuccinimide thus deposited was collected by filtration.

100 ml of dioxane was added to 5.7 g of N-hydroxy-2,2-dimethylsuccinimide and 10.7 g of 1,2-naphthoquinone-2-diazido-4-sulfonyl chloride and to the mixture was added dropwise with stirring a solution containing 4.1 g of triethylamine dissolved in 20 ml of dioxane while cooling the temperature of the reaction solution below 25° C. for 2 hours. After further reacting for 2 hours at a temperature of 15° C. to 25° C., the reaction solution was poured into 300 ml of water. The precipitates thus formed were collected by filtration and recrystallized from acetonitrile to obtain 10 g of N-(1,2-naphthoquinone-2-diazido-4-sulfonyloxy)-2,2-dimethylsuccinimide. The melting point was 157° to 159° C. (decomp.).

SYNTHESIS EXAMPLE 3

Synthesis of N-(1,2-naphthoquinone-2-diazido-4-sulfonyloxy)-5-norbornene-2,3-dicarboxylic acid imide [Compound No. 14]

30 ml of water was added to 24.6 g of 5-norbornene-2,3-dicarboxylic acid anhydride, and while cooling the reaction temperature below 20° C., 10.6 g of sodium carbonate and then 13.9 g of hydroxylamine hydrochloride were added. The mixture was reacted at room temperature for 1 hour and then reacted at a temperature of 60° to 70° C. for 1 hour. After cooling to room temperature, N-hydroxy-5-norbornene-2,3-dicarboxylic acid imide thus formed was collected by filtration.

100 ml of tetrahydrofuran was added to 9.0 g of N-hydroxy-5-norbornene-2,3-dicarboxylic acid imide and 13.4 g of 1,2-naphthoquinone-2-diazido-4-sulfonyl chloride and to the mixture was added dropwise a solution containing 5.1 g of triethylamine dissolved in 20 ml of tetrahydrofuran while cooling the temperature of the reaction solution below 25° C. for 2 hours. After further reacting for 2 hours at room temperature, the reaction solution was poured into 400 ml of water. The precipitates thus formed were collected by filtration and recrystallized from a solvent mixture of methyl Cellosolve and acetonitrile to obtain 12.0 g of N-(1,2-naphthoquinone-2-diazido-4-sulfonyloxy)-5-norbornene-2,3-dicarboxylic acid imide. The melting point was 160° to 162° C. (decomp.).

SYNTHESIS EXAMPLE 4

Synthesis of N-(1,2-naphthoquinone-2-diazido-4-sulfonyloxy)phthalimide [Compound No. 18]

100 ml of acetonitrile was added to 8.2 g of N-hydroxyphthalimide and 13.4 g of 1,2-naphthoquinone-2-diazido-4-sulfonyl chloride and to the mixture was added dropwise a solution containing 5.0 g of triethylamine dissolved in 20 ml of acetonitrile while cooling the temperature of the reaction solution below 25° C. for 2 hours. After further reacting for 2 hours at room temperature, the reaction solution was poured into 500 ml of water. The precipitates thus formed were collected by filtration and recrystallized from a solvent mixture of methyl Cellosolve and acetonitrile to obtain 11.5 g of N-(1,2-naphthoquinone-2-diazido-4-sulfonyloxy)phthalimide. The melting point was 159° to 161° C. (decomp.).

EXAMPLE 1

On an aluminum plate of 0.15 mm thickness a surface of which had been grained, a photosensitive solution having the following composition was coated using a whirler and dried at 80° C. for 5 minutes to prepare a photosensitive printing plate.

| | |
|---|---|
| Cresol Novolak Resin | 10.5 g |
| o-Naphthoquinonediazide Compound shown in Table 1 | 3.0 g |
| Crystal Violet | 0.1 g |
| Tetrahydrofuran | 70 ml |
| Methyl Cellosolve | 15 ml |
| N,N—Dimethylformamide | 35 ml |

Each of these photosensitive printing plates was exposed at 15 counts using a jet printer (having a super high pressure mercury lamp of 2 KW manufactured by ORC Seisakusho) and the optical densities of the photosensitive layer at the exposed portions and unexposed portions were measured using a reflection densitometer. The optical densities of the exposed portions and the unexposed portions and the difference between these optical densities ($\Delta D$) were shown in Table 1 below. The image obtained is observed clearer as the $\Delta D$ is larger.

TABLE 1

Property of Visible Image Obtained by Light Exposure of Photosensitive Printing Plate

| Test No. | o-Naphthoquinone Compound | Unexposed portion | Exposed portion | $\Delta D$ |
|---|---|---|---|---|
| 1 | Compound No. 18 | 0.99 | 0.77 | 0.22 |
| 2 | Compound No. 16 | 1.00 | 0.72 | 0.28 |
| Comparative Example 1 | 1,2-Naphthoquinone-2-diazido-4-sulfonyl chloride | 0.77 | 0.53 | 0.24 |
| Comparative Example 2 | 1,2-Naphthoquinone-2-diazido-4-sulfonic acid p-dimethylphenyl-methylphenyl ester | 0.96 | 0.91 | 0.05 |
| Comparative Example 3 | 1,2-Naphthoquinone-2-diazido-4-sulfonic acid p-tert-butylphenyl ester | 1.00 | 0.95 | 0.05 |
| Comparative Example 4 | N—(1,2-Naphthoquinone-2-diazido-4-sulfonyl)morpholine | 0.98 | 0.97 | 0.01 |
| Comparative Example 5 | 1,2-Naphthaquinone-2-diazido-4-sulfonic acid phenyl ester | 0.98 | 0.91 | 0.07 |

As is apparent from the results shown in Table 1, the difference between the optical density of the exposed portions and that of the unexposed portions ($\Delta D$) is small with the samples using the sulfonic acid ester or the sulfonamide as shown in Comparative Example 2 to Comparative Example 5. On the other hand, with the sample using 1,2-naphthoquinone-2-diazido-4-sulfonyl chloride as shown in Comparative Example 1, the disadvantage is that the optical density of the unexposed portion is decreased even though the value of $\Delta D$ is large. In comparison with these samples, the samples using the o-naphthoquinonediazide compound according to the present invention can provide a sufficiently large $\Delta D$ value without a decrease in the optical density of the unexposed portions. Thus the objects of the present invention are achieved.

On each of the photosensitive printing plates prepared in this example was placed a step wedge (the optical density difference between two adjacent steps was 0.15 and the number of the optical density steps was from 0 to 15), and the photosensitive printing plate was exposed at 15 counts using a jet printer as described above and, then, developed at 25° C. for 60 seconds with a solution prepared by diluting 15 times in volume DP-3 (trade name, a developing solution for a positive type PS plate manufactured by Fuji Photo Film Co., Ltd.). The sensitivity was determined. The step number of the step wedge corresponding to the image provided is shown in Table 2 below. The larger the the step number is the higher the sensitivity is.

TABLE 2

Property of Photosensitive Printing Plate after Exposure and Development

| Test No. | o-Naphthoquinone Compound | Step Number of Step Wedge after Development |
|---|---|---|
| 1 | Compound 18 | 4 |
| 2 | Compound 16 | 4 |
| Comparative Example 1 | 1,2-Naphthoquinone-2-diazido-4-sulfonyl chloride | 2 |
| Comparative Example 2 | 1,2-Naphthoquinone-2-diazido-4-sulfonic acid p-dimethylphenylmethylphenyl ester | 3.5 |
| Comparative Example 3 | 1,2-Naphthoquinone-2-diazido-4-sulfonic acid p-tert-butylphenyl ester | 3 |
| Comparative Example 4 | N—(1,2-Naphthoquinone-2-diazido-4-sulfonyl)morpholine | 5 |
| Comparative Example 5 | 1,2-Naphthoquinone-2-diazido-4-sulfonic acid phenyl ester | 2.5 |

When the o-naphthoquinonediazide compound as shown in Comparative Example 4 is used, the sensitivity of the photosensitive printing plate is high as shown in Table 2. However, the value of ΔD is small as previously shown in Table 1. When the o-naphthoquinonediazide compound as shown in Comparative Example 1 is used, the value of ΔD is large as shown in Table 1. However, the sensitivity is low. On the contrary, the photosensitive printing plates containing the o-naphthoquinonediazide compound according to the present invention provide both a large value of ΔD and sufficiently high sensitivity.

EXAMPLE 2

On an aluminum plate subjected to the same treatment as shown in Example 1, a photosensitive solution having the following composition was coated using a whirler and dried at 100° C. for 2 minutes to prepare a photosensitive printing plate.

Condensation product of 1,2-naphthoquinone-2-diazido-5-sulfonyl chloride and m-cresol -continued

| formaldehyde novolak resin (condensation ratio of 33 mol %) | 0.60 g |
|---|---|
| o-Naphthoquinonediazide Compound shown in Table 3 | 0.14 g |
| Cresol Novolak Resin | 2.0 g |
| Tetrahydrophtharic Acid Anhydride | 0.15 g |
| Crystal Violet | 0.02 g |
| Ethylene Dichloride | 18 g |
| Methyl Cellosolve | 12 g |

Each of these photosensitive printing plates was exposed to a carbon arc lamp of 30 amperes at a distance of 70 cm and then developed at 25° C. for 30 seconds with a solution prepared by diluting 6 times in volume DP-3 (trade name, a developing solution for a positive type PS plate manufactured by Fuji Photo Film Co., Ltd.). The sensitivity was determined. The sensitivity was evaluated using a step wedge (the optical density difference between two adjacent steps was 0.15 and the number of the optical density steps was from 0 to 15). The larger the step number is the higher the sensitivity is.

The optical densities of the photosensitive layer at the exposed portions and the unexposed portions after exposure alone were measured using a Macbeth reflection densitometer.

Each of the unexposed photosensitive printing plates was allowed to stand under natural conditions for 2 months, then exposed to light and subjected to measurement as described above.

The image obtained by light exposure was observed clearer as the difference (ΔD) between the optical density of the exposed portions and that of the unexposed portions is larger.

TABLE 3

Property of Photosensitive Printing Plate

| | | | Optical Density of Photosensitive Layer | | | | | |
|---|---|---|---|---|---|---|---|---|
| | | Step Number of Step Wedge (Sensitivity of Resist) | One Day after Coating | | | After Natural Ageing for Two Months | | |
| Test No. | o-Naphthoquinone-diazide Compound | | Unexposed Portion | Exposed Portion | ΔD | Unexposed Portion | Exposed Portion | ΔD |
| 1 (Present invention) | Compound No. 21 | 3.8 | 0.88 | 0.73 | 0.15 | 0.88 | 0.74 | 0.14 |
| 2 (Comparative Example) | None | 3.8 | 0.88 | 0.88 | 0.00 | 0.88 | 0.88 | 0.00 |
| 3 (Comparative Example) | 1,2-Naphthoquinone-2-diazido-4-sulfonic acid phenyl ester | 3.8 | 0.88 | 0.80 | 0.08 | 0.87 | 0.82 | 0.05 |
| 4 (Comparative Example) | 1,2-Naphthoquinone-2-diazido-4-sulfonic acid 2,4-dinitrophenyl ester | 3.5 | 0.86 | 0.78 | 0.08 | 0.85 | 0.81 | 0.04 |

As is apparent from the results shown in Table 3, with the sample using 1,2-naphthoquinone-2-diazido-4-sulfonic acid 2,4-dinitrophenyl ester, the value of ΔD is not sufficiently large, the optical density of the unexposed portions is decreased and further the sensitivity of resist is decreased. On the contrary, the sample using the o-naphthoquinonediazide compound according to the present invention exhibits a large ΔD value and excellent ageing stability without adversely affecting the sensitivity of the resist. Therefore, the objects of the present invention are achieved.

EXAMPLE 3

On an aluminum plate of 0.24 mm thickness which had been grained and then subjected to an anodic oxidation, a photosensitive solution having the following composition was coated and dried for 2 minutes at 100° C.

| | |
|---|---|
| Esterification reaction product of naphthoquinone-(1,2)-diazido-(2)-5-sulfonylchloride and cresol novolak resin | 0.75 g |
| Cresol Novolak Resin | 2.10 g |
| Tetrahydrophthalic Acid Anhydride | 0.15 g |
| Compound No. 2 | 0.10 g |
| Crystal Violet | 0.01 g |
| Oil Blue #603 (made by Orient Kagaku Kogyo K.K.) | 0.01 g |
| Ethylene Dichloride | 18 g |
| Methyl Cellosolve Acetate | 12 g |

The coverage of the coating solution after drying was 2.2 g/m².

The photosensitive lithographic printing plate thus obtained could provide a clear printout image by image exposure only without development. The exposed portions were faded. However, the unexposed portions kept the original density and the image formed could be distinguished even in fine portions under a safety lamp.

EXAMPLE 4

On the aluminum plate as used in Example 3 was coated a photosensitive solution having the following composition to prepare a photosensitive lithographic printing plate.

| | |
|---|---|
| Esterification product of naphthoquinone-(1,2)-diazido-(2)-5-sulfonylchloride and poly-p-hydroxystyrene (molecular weight of 7,000) | 0.70 g |
| Cresol Novolak Resin | 2.25 g |
| p-tert-Butylphenol Novolak Resin | 0.05 g |
| Tetrahydrophthalic Acid Anhydride | 0.15 g |
| Compound No. 9 | 0.10 g |
| Oil Blue #603 (made by Orient Kagaku Kogyo K.K.) | 0.02 g |
| Tetrahydrofuran | 18 g |
| Methyl Cellosolve Acetate | 12 g |

By imagewise exposing the photosensitive plate, a clear printout image was obtained without development.

EXAMPLE 5

On the aluminum plate as used in Example 3 was coated a photosensitive composition having the following composition to provide a photosensitive lithographic printing plate. By imagewise exposing the photosensitive plate, a clear printout image could be obtained without need of development.

| | |
|---|---|
| Esterification product of naphthoquinone-(1,2)-diazido-(2)-5-sulfonylchloride and pyrogallol acetone resin | 0.75 g |
| Cresol Novolak Resin | 2.10 g |
| p-tert-Butylphenol Novolak Resin | 0.05 g |
| Tetrahydrophthalic Acid Anhydride | 0.15 g |
| Thymol Blue | 0.02 g |
| Compound No. 14 | 0.10 g |
| Ethylene Dichloride | 18 g |
| Methyl Cellosolve Acetate | 12 g |

EXAMPLE 6

On the non-coated aluminum plate as used in Example 1 was coated a photosensitive solution having the following composition using a whirler and the plate was dried for 2 minutes at 100° C.

| | |
|---|---|
| p-Toluenesulfonate of the condensate of p-diazodiphenylamine and paraformaldehyde | 0.2 g |
| Polyvinyl Formal | 0.75 g |
| Compound No. 18 | 0.10 g |
| Crystal Violet | 0.02 g |
| Methyl Cellosolve | 20 g |
| Methanol | 5 g |

The dry coverage of the coated composition was 0.98 g/m².

The photosensitive lithographic printing plate was exposed for 30 seconds to a carbon arc lamp of 30 amperes with a distance of 70 cm. The exposed portions were faded but the unexposed portions kept their original density. The printout image obtained were recognizable in fine portions under a safety lamp.

The plate was immersed in a developing solution having the following composition for 1 minute at room temperature and then the unexposed portions were removed by lightly rubbing the surface thereof with an absorbent cotton, thereby a lithographic printing plate was obtained.

| | |
|---|---|
| Sodium di(2-ethylhexyl)phosphate | 10 g |
| Water | 90 g |

EXAMPLE 7

On an aluminum plate was coated a photosensitive solution having the following composition as in Example 6 and dried.

| | |
|---|---|
| p-Toluenesulfonate of the condensate p-diazophenylamine and paraformaldehyde | 0.2 g |
| Polyvinyl Formal | 0.75 g |
| Compound No. 18 | 0.10 g |
| N,N—Dimethylaniline | 0.02 g |
| Methyl Cellosolve | 20 g |
| Methanol | 5 g |

The dry coverage of the coating composition was 1.0 g/m². When the photosensitive lithographic printing plate was imagewise exposed, the exposed portions became purple, while the unexposed portions kept original yellow color. Thereby it was possible to obtain a printout image which could be recognized even in fine portions under a safety lamp.

While the invention has been described in detail and with reference to specific embodiments thereof, it will be apparent to one skilled in the art that various changes and modifications can be made therein without departing from the spirit and scope thereof.

What is claimed is:

1. A photosensitive composition containing at least one o-naphthoquinonediazide compound represented by the following general formula (I)

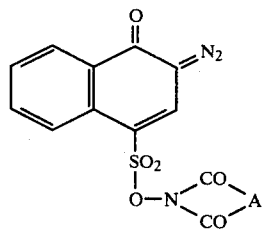

wherein A represents a divalent aliphatic residue, a divalent substituted aliphatic residue, a divalent aromatic residue or a divalent substituted aromatic residue, and a discoloring agent which changes its color tone upon the interaction with a photodecomposition product of the o-naphthoquinonediazide compound.

2. The photosensitive composition as claimed in claim 1, wherein the divalent aliphatic residue represented by A is a straight chain, branched chain and/or cyclic residue containing a saturated bond and/or unsaturated bond.

3. The photosensitive composition as claimed in claim 1, wherein the divalent aliphatic residue represented by A contains 2 to 20 carbon atoms.

4. The photosensitive composition as claimed in claim 1, wherein the divalent substituted aliphatic residue represented by A is a divalent aliphatic residue substituted with an aryl group, a divalent aliphatic residue in which an ether bond is formed or a divalent aliphatic residue substituted with a halogen atom.

5. The photosensitive composition as claimed in claim 1, wherein the divalent aromatic residue represented by A is an arylene group or an aromatic heterocyclic residue.

6. The photosensitive composition as claimed in claim 1, wherein the divalent aromatic residue represented by A is a monocyclic group or a dicyclic group.

7. The photosensitive composition as claimed in claim 1, wherein the divalent substituted aromatic residue represented by A is a divalent aromatic residue substituted with a lower alkyl group, a halogen atom, a nitro group or an acetamino group.

8. The photosensitive composition as claimed in claim 1, wherein A represents a phenylene group substituted with an alkyl group, a phenylene group substituted with a halogen atom or a phenylene group.

9. The photosensitive composition as claimed in claim 1, wherein the discoloring agent is inherently colorless but is colored upon reaction with the photodecomposition product of the compound represented by the general formula (I).

10. The photosensitive composition as claimed in claim 1, wherein the discoloring agent is originally colored but is discolored or decolored upon reaction with the photodecomposition product of the compound represented by the general formula (I).

11. The photosensitive composition as claimed in claim 1, wherein the discoloring agent is a primary aromatic amine, a secondary aromatic amine or a leuco dye.

12. The photosensitive composition as claimed in claim 1, wherein the discoloring agent is a diphenylmethane series dye, a triphenylmethane series dye, a thiazine series dye, an oxazine series dye, a xanthene series dye, an anthraquinone series dye, an iminonaphthoquinone series dye or an azomethine series dye.

13. The photosensitive composition as claimed in claim 1, wherein the compound represented by the general formula (I) is present in an amount of 0.01 to 100 parts by weight per 1 part by weight of the discoloring agent.

14. The photosensitive composition as claimed in claim 1, wherein the composition additionally containing a photosensitive resist forming material.

15. The photosensitive composition as claimed in claim 14, wherein the photosensitive resist forming material is a diazo resin or an o-quinonediazide compound.

16. The photosensitive composition as claimed in claim 14, wherein the photosensitive resist forming material is a condensate of a p-diazodiphenylamine and paraformaldehyde.

17. The photosensitive composition as claimed in claim 14, wherein the photosensitive resist forming material is an o-naphthoquinonediazide compound.

18. The photosensitive composition as claimed in claim 1, wherein the composition additionally containing a diazo resin and a binder polymer containing a hydroxy group, an amino group, a carboxylic acid group, an amido group, a sulfonamido group, an active methylene group, a thioalcohol group or an epoxy group.

19. The photosensitive composition as claimed in claim 18, wherein the binder polymer is present in an amount of 40 to 95% by weight of the photosensitive composition.

20. The photosensitive composition as claimed in claim 1, wherein the composition additionally containing an o-naphthoquinonediazide compound and an alkali-soluble resin.

21. The photosensitive composition as claimed in claim 20, wherein the alkali-soluble resin is present in an amount of 50 to 85% by weight of the photosensitive composition.

22. The photosensitive composition as claimed in claim 14, wherein the combined amount of the discoloring agent and the compound represented by the general formula (I) is 0.1 to 150 parts by weight per 100 parts by weight of the photosensitive resist forming material.

23. A photosensitive element, comprising:
a support; and
a photosensitive layer on the support wherein the layer is comprised of an o-naphthoquinonediazide compound represented by the following general formula (I)

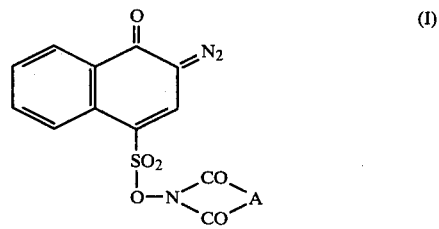

wherein A represents a divalent aliphatic residue, a divalent substituted aliphatic residue, a divalent aromatic residue or a divalent substituted aromatic residue, and a discoloring agent which changes its color tone upon the interaction with a photodecomposition product of the o-naphthoquinonediazide compound.

* * * * *